United States Patent [19]

Aldridge et al.

[11] 4,198,603
[45] Apr. 15, 1980

[54] RADIO RECEIVER AUDIO ATTENUATOR

[75] Inventors: Frederick A. Aldridge, Russiaville; James T. Gotshall; Burtron D. Schertz, both of Kokomo, all of Ind.

[73] Assignee: General Motors Corporation, Detroit, Mich.

[21] Appl. No.: 944,910

[22] Filed: Sep. 22, 1978

[51] Int. Cl.² ............................................. H04B 1/16
[52] U.S. Cl. ................................. 455/234; 179/1 VL; 455/253
[58] Field of Search ............... 325/400, 402, 403, 404, 325/408, 409, 411, 412, 413, 415, 319; 333/81 R; 179/1 VL

[56] References Cited

U.S. PATENT DOCUMENTS

| | | | |
|---|---|---|---|
| 2,831,969 | 4/1958 | Jankowski | 325/400 |
| 3,323,066 | 5/1967 | Kurtz | 325/403 |
| 3,495,247 | 2/1970 | Perkins | 325/404 |
| 3,496,481 | 2/1970 | Torick et al. | 325/408 |
| 3,769,592 | 10/1973 | Espe | 325/478 |
| 3,824,345 | 7/1974 | Cowpland | 179/1·VL |
| 3,849,601 | 11/1974 | Goncharoff | 179/1 D |

*Primary Examiner*—Marc E. Bookbinder
*Attorney, Agent, or Firm*—Robert M. Sigler

[57] ABSTRACT

A radio receiver includes apparatus for attenuating the audio signal derived from weak and noisy radio frequency signals to render the resulting noisy output audio signals less objectionable. Apparatus is provided to attenuate the AGC audio frequency signal in a predetermined constant attenuation, linearly mix the AGC regulated and attenuated audio frequency signals in a proportion controlled by an attenuation control signal and generate tne attenuation control signal from the difference between the radio AGC signal and a predetermined constant reference.

2 Claims, 3 Drawing Figures

RADIO RECEIVER AUDIO ATTENUATOR

BACKGROUND OF THE INVENTION

This invention relates to radio receivers and especially to such receivers employing automatic gain control to regulate the output volume for received radio frequency signals of widely varying strength. Such radios provide high gain for low strength radio frequency signals such as are obtained from weak or distant radio stations or from inter-station noise.

In an entertainment band AM radio receiver, the AGC circuitry tends to cause high gain of inter-station noise encountered while tuning from one station to another. Such noise has been silenced in some prior art receivers by the use of muting circuits which switch off the audio signal except when a signal of sufficient strength is received. In addition to being expensive, such circuits provide complete silence between station. Such silence causes the radio operator to lose the "feel" of the radio being on as he is tuning from one station to another and further could fool the operator into believing his radio is inoperative if he turns it on while it is tuned off channel. Further, the abrupt shift from silence to full volume when a station is tuned can be disconcerting if the volume is turned too high. It would be desirable, in such entertainment AM radios, to reduce the volume of inter-station noise to a less objectionable level without removing it completely from the tuning process.

In addition, Citizens band AM radios also use automatic gain control to reduce the difference in volume level of received signals of widely varying strength. Such CB radios also generally include a squelch control which determines the minimum strength of a signal which the receiver is allowed to receive and which may be adjusted by the radio operator. Because of the high noise level of weak, highly amplified signals, a CB radio listener in a vehicle, for instance, might set his squelch level to receive only the strongest signals, even if the channel is not crowded. However, this might cause him to miss an important part of a conversation or a warning of some problem on the read ahead. If apparatus were provided for automatically reducing the volume of weak and noisy signals without losing the signals entirely, the operator could set his squelch level to receive weaker signals. The volume of such weaker signals would, of course, be lower, but they would be received and heard.

SUMMARY OF THE INVENTION

It is therefore an object of this invention to provide an improved radio receiver in which the volume level of weak and noisy signals is automatically attenuated to a level which is still audible but not objectionably loud.

It is a further object of this invention to provide an improved radio receiver wherein the volume level is smoothly attenuated, for increasingly weak and noisy signals, to minimize sudden jumps in volume level to the greatest degree while providing volume reduction of weak, noisy signals.

It is yet another object of this invention to provide an automatic signal strength responsive audio attenuator for a radio receiver in a form suitable for construction as an integrated circuit.

These objects and other advantages are obtained with apparatus which is effective to attenutate the AGC regulated audio frequency signal of a radio receiver in a predetermined constant attenuation, linearly mix the AGC regulated audio frequency signal and the attenuated audio frequency signal in controllable relative proportion in response to an attenuation control signal and generate the attenuation control signal in response to the difference between the radio receiver AGC signal and a predetermined constant reference in order to provide an output audio frequency signal with controlled attenuation varying between no attenuation for an AGC signal indicating a strong received radio frequency signal, and the predetermined constant attenuation for an AGC signal indicating a weak and therefore noisy received radio frequency signal. To provide such apparatus suitable for integrated circuit manufacture, balanced current steering circuitry is used for the linear mixer, while suitable current sources provide the AGC regulated and attenuated audio frequency signals.

Further details and advantages of the invention will be apparent from the accompanying drawings and following description of a preferred embodiment.

DESCRIPTION OF THE PREFERRED EMBODIMENT

Figure 1:
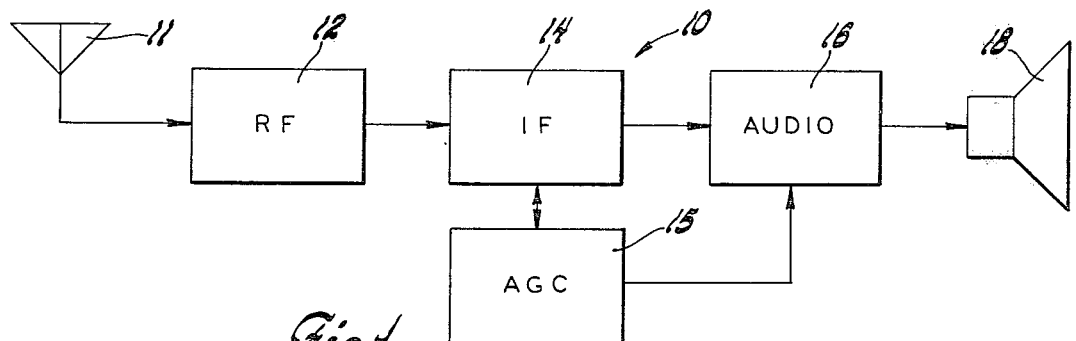
FIG. 1 is a block diagram representing a radio receiver according to this invention.

Referring to FIG. 1, a radio receiver 10 includes an antenna 11, which receives a radio frequency signal and supplies it to an RF tuner and amplifier stage 12. The signal is tuned and amplified in the RF stage 12 and converted to an intermediate frequency for amplification in IF amplifier stage 14. AGC apparatus 15 is responsive to a signal level in the IF amplifier stage 14 to generate an AGC voltage which varies with signal strength. This AGC voltage is applied in the standard manner to another portion of the IF amplifier stage 14 to control the IF gain in such a way as to reduce the variation in signal level at the output of IF amplifier stage 14 for the various signal levels at the input of IF amplifier stage 14. The controlled output from IF amplifier stage 14 is supplied to a detector and audio amplifier 16, which supplies a power audio signal to a speaker 18. The portions of the radio receiver described to this point are conventional and can take many forms within the present state of the art.

Figure 2:
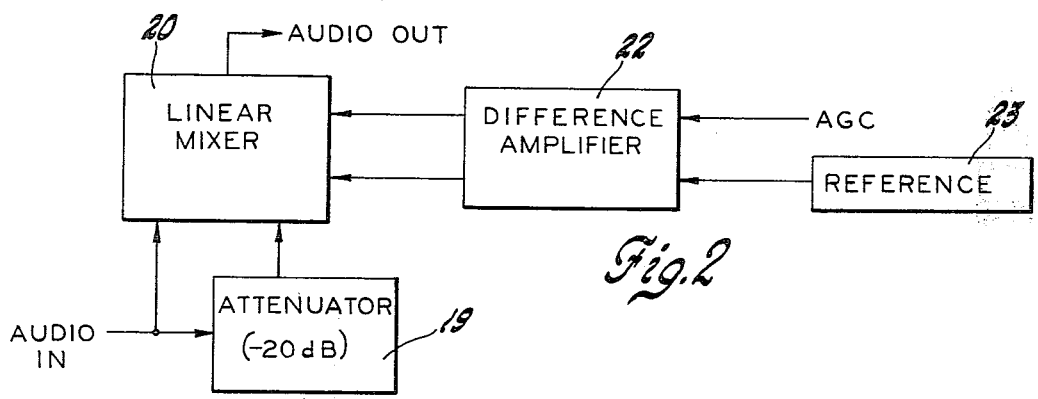
FIG. 2 is a block diagram of a portion of the audio section of the receiver of FIG. 1.

FIG. 2 shows a portion of the audio stage 16. An audio signal, which is subject to the gain control imposed by AGC apparatus 15 and IF amplifier stage 14, is provided to an attenuator 19, which provides a predetermined constant attenuation, such as 20 decibels in this embodiment. The audio signal is also provided, along with the output of attenuator 19, to a linear mixer 20, in which these two audio frequency signals are mixed to produce an audio frequency output signal having a signal strength variable between the strength of the audio input signal and strength of the fully attenuated signal from attenuator 19. The degree of attenuation in this audio frequency output signal is controlled by a difference amplifier 22, which amplifies the difference between the AGC voltage from AGC apparatus 15 and a reference voltage from a reference source 23 and applies this amplified difference voltage to linear mixer 20. Thus, the degree of attenuation of the output audio signal is controlled in response to the AGC voltage from AGC apparatus 15 and thus in response to received RF signal strength.

Figure 3:
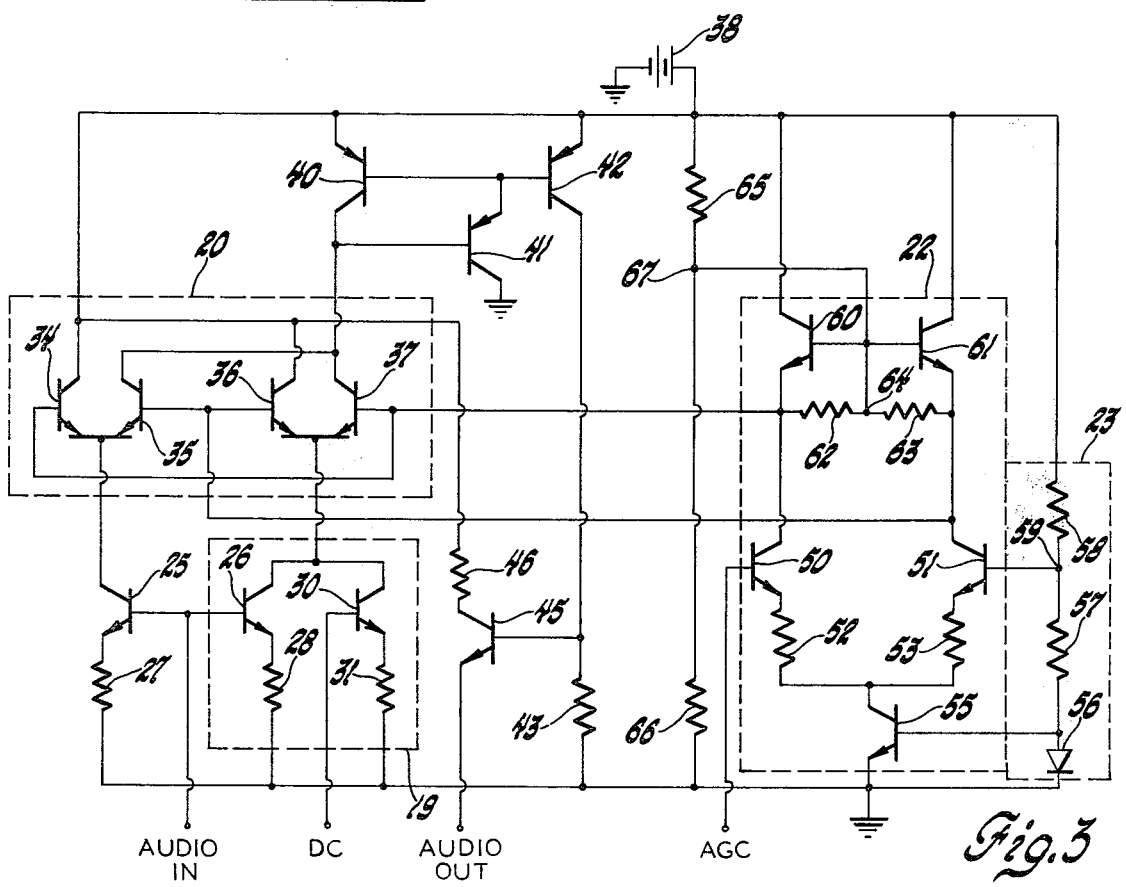
FIG. 3 is a circuit diagram of the system shown in FIG. 2.

FIG. 3 shows a circuit embodiment of the apparatus of FIG. 2 which is suitable for manufacture as an integrated circuit. The audio input signal is supplied to the bases of a pair of NPN transistors 25 and 26, the emitters of which are connected to ground through resistors 27 and 28, respectively. Another NPN transistor 30 has an emitter connected through a resistor 31 to ground and a collector connected to the collector of transistor 26.

The input AGC regulated audio frequency signal is provided to the bases of transistors 25 and 26; and a predetermined constant DC voltage is provided to the base of transistor 30. Resistor 27 has a resistance of, for example, 1.36 kilohms; and the combination of transistor 25 and resistor 27 acts as a current source with an output current that varies with the input audio frequency signal about a predetermined constant quiescent current level. Resistors 28 and 31 have resistances of 15 and 1.5 kilohms, respectively; and the combinations of transistor 26 with resistor 28 and transistor 30 with resistor 31 function as separate current sources, the output currents of which are summed to form a single current source. The current from transistor 26 varies with the input audio frequency signal; but, because of the larger resistance value of resistor 28 compared with that of resistor 27, both the variation in current level and the constant quiescent level of transistor 26 are smaller than those of transistor 25 in a predetermined attenuation. However, the input DC voltage to the base of transistor 30 is selected to produce a constant output current from transistor 30 which is sufficient to bring the total quiescent current level of transistors 26 and 30 up to the quiescent current level of transistor 25. Thus, the combination of transistors 26 and 30 and resistors 28 and 31 produces a current signal which varies with the input audio frequency signal and has the same quiescent current level as that of transistor 25 but has variations from that quiescent current level which are attenuated by a constant attenuation compared with the current signal from transistor 25, the attenuation being 20 decibels with the resistance values given. This combination comprises attenuator 19.

A first pair of NPN transistors 34 and 35 have their emitters connected to the collector of transistor 25. A second pair of NPN transistors 36 and 37 have their emitters connected to the collectors of both transistors 26 and 30. The bases of transistors 35 and 36 are connected together, as are the bases of transistors 34 and 37. The collectors of transistors 34 and 36 are both connected to a source of positive potential or battery 38; and the collectors of transistors 35 and 37 are connected together to form an output for the combination.

This combination of transistors 34–37 comprises a linear mixer in the form of balanced current steering apparatus. This apparatus receives the current signal input from transistor 25, which represents the input audio frequency signal, and the current signal input from attenuator 19, which represents the attenuated input audio frequency signal, and sums complementary percentages of them to form an output current signal, the precise percentages or proportion being determined by the voltages applied to the bases of the transistors 34–37. Complementary percentages are herein defined as two percentages which add up to 100 percent. Such circuit combinations are well known in the integrated circuit art. The term linear mixer is used to distinguish this apparatus from the non-linear mixer used in superheterodyne tuners to generate a beat frequency.

The collectors of transistors 35 and 37 are connected to the collector of a PNP transistor 40, the emitter of which is connected to positive potential source 38, and are further connected to the base of another PNP transistor 41, the collector which is grounded, and the emitter of which is connected to the base of transistor 40 and the base of another PNP transistor 42. The emitter of transistor 42 is connected to positive potential source 38; and its collector is connected through a resistor 43 to ground and to the base of an NPN transistor 45. The collector of transistor 45 is connected through a resistor 46 to positive potential source 38; and its emitter provides an output for the audio frequency signal from the circuit of FIG. 3. Transistors 40–42 provide a current mirror for the output current of linear mixer 20, which output current is transformed to a voltage signal by resistor 43 and supplied as an output from the circuit through the emitter follower transistor 45.

A pair of NPN transistors 50 and 51 have emitters connected through resistors 52 and 53, respectively, to the collector of a transistor 55 having a grounded emitter and a base connected through a diode 56 to ground and through a pair of series resistors 57 and 58 to positive potential source 38. The base of transistor 51 is connected to the junction 59 of resistors 57 and 58; while the base of transistor 50 provides an input for the AGC voltage from AGC apparatus 15.

The collector of transistor 50 is connected to the bases of transistors 37 and 34 in linear mixer 20 and to the emitter of an NPN transistor 60. The collector of transistor 51 is connected to the bases of transistors 35 and 36 in linear mixer 20 and to the emitter of an NPN transistor 61, the base of which is connected to the base of transistor 60. A pair of resistors 62 and 63 are connected in series between the emitters of transistors 60 and 61; and their junction 64 is connected to the bases of transistors 60 and 61. The collectors of transistors 60 and 61 are both connected to the positive potential source 38. A pair of resistors 65 and 66 is connected in series between positive potential source 38 and ground and their junction 67 is connected to the bases of transistors 60 and 61.

Transistors 50 and 51 comprise a differential threshold detector or difference amplifier having a current source in transistor 55 and an active load in transistors 60 and 61. The voltage divider formed by resistors 57 and 58 comprises a constant voltage reference 23 and provides one input to the difference amplifier; while the AGC voltage provides the other input. The output of difference amplifier 22 is coupled to the bases of transistors 34–37 in linear mixer 20 to control the degree of attenuation in the output audio frequency signal from transistor 45 between no attenuation for a minimum AGC voltage and 20 decibels of attenuation, in this embodiment, for a maximum AGC voltage.

Thus the volume level from speaker 18 of receiver 10 is modified from the volume level produced by the AGC circuit in the case of weak and noisy received radio frequency signals. This modification takes the form of a gradual reduction in volume for increasingly weak signals up to a limit of a predetermined constant attenuation, for the weakest signals, which renders the output audio sound audible but reduced in volume sufficiently that noise in the signal is not so objectionably loud. The maximum attenuation ratio may vary somewhat for different radio uses and environments; however, this embodiment suggests 20 db for an entertainment or citizens band AM radio in a motor vehicle.

The embodiments of the invention in which an exclusive property or privilege is claimed are defined as follows:

1. In a radio receiver including means effective to receive a radio frequency signal over a predetermined range of varying signal strength, derive an intermediate frequency signal from said radio frequency signal, amplify said intermediate frequency signal, generate an AGC signal varying with received signal strength, regulate the amplified intermediate frequency signal in strength over the predetermined range of received signal strength in response to said AGC signal and derive an audio frequency signal from said regulated intermediate frequency signal, the improvement comprising:
   means effective to attenuate the audio frequency signal by a predetermined constant attenuation;
   means effective to linearly mix the audio frequency signal and attenuated audio frequency signal in controllable relative proportion to generate an output audio signal having an attenuation controllable between zero and the predetermined constant attenuation in response to an attenuation control signal; and
   means effective to derive the attenuation control signal from the AGC signal and provide said attenuation signal to the linear mixing means in sense to vary the attenuation of the output audio signal inversely with received signal strength, whereby the output audio signal is attenuated smoothly, up to the limit of said predetermined constant attenuation, for increasingly weak and therefore noisy radio frequency signals, to render the resulting noisy output audio signals less objectionable.

2. In a radio receiver including means effective to receive a radio frequency signal over a predetermined range of varying signal strength, derive an intermediate frequency signal from said radio frequency signal, amplifying said intermediate frequency signal, generate an AGC signal varying with received signal strength, regulate the amplified intermediate frequency signal in signal strength over the predetermined range of received radio frequency signal strength in response to said AGC signal and derive an audio frequency signal from said regulated intermediate frequency signal, the improvement comprising:
   a first current source effective to generate a first electric current varying from a first predetermined constant quiescent current level in response to the audio frequency signal;
   a second current source effective to generate a second electric current varying from a second predetermined constant quiescent current level, smaller than said first constant quiescent current level, in response to the audio frequency signal, the size of the variation of the second electric current from the second constant quiescent current level being attenuated from the size of the variation of the first electric current from the first constant quiescent current level by a constant predetermined attenuation;
   a third current source effective to generate a third electric current equal to the difference between the first and second constant quiescent current levels;
   current steering means having two inputs, one input receiving the first electric current and the other input receiving the sum of the second and third electric currents, the current steering means being effective to sum complementary percentages of the two inputs in controllable relative proportion and generate thereby an output audio signal varying with the input audio signal but having an attenuation controllable between zero and the predetermined constant attenuation in response to an attenuation control signal; and
   difference amplifier means having as inputs the AGC signal and a constant predetermined reference and being effective to generate therefrom the amplified difference as the attenuation control signal and provide said signal to said current steering means in a sense to vary the attenuation of the output audio signal inversely with received signal strength, whereby the output audio signal is attenuated smoothly, up to the limit of said predetermined constant attenuation, for increasingly weak and therefore noisy radio frequency signals, to render the resulting noisy output audio signals less objectionable.

* * * * *